United States Patent [19]

Ichigaya

[11] 4,127,049
[45] Nov. 28, 1978

[54] SIGNAL GENERATING SYSTEM UTILIZING A CATHODE RAY TUBE

[75] Inventor: Hiroshi Ichigaya, Warabi, Japan

[73] Assignee: Sony Corporation, Tokyo, Japan

[21] Appl. No.: 734,606

[22] Filed: Oct. 21, 1976

[30] Foreign Application Priority Data

| Oct. 22, 1975 | [JP] | Japan | 50-127088 |
| Dec. 27, 1975 | [JP] | Japan | 50-156976 |
| May 14, 1976 | [JP] | Japan | 51-55061 |
| May 20, 1976 | [JP] | Japan | 51-58293 |

[51] Int. Cl.$^2$ .............................................. G10H 3/06
[52] U.S. Cl. ....................................... 84/1.18; 84/1.17;
84/DIG. 6; 315/365; 328/124; 364/855
[58] Field of Search ....................... 84/1.01, 1.17, 1.18,
84/DIG. 6; 179/1 SG, 1 SM, 1 SP, 1 M;
315/365; 328/124; 364/855

[56] References Cited

U.S. PATENT DOCUMENTS

| 2,171,936 | 9/1939 | Kucher | 84/1.18 |
| 2,402,058 | 6/1946 | Loughren | 84/1.18 X |
| 2,900,861 | 8/1959 | Davis | 84/1.18 X |
| 3,519,722 | 7/1970 | Heytow | 84/1.17 |
| 3,656,776 | 3/1972 | Milde, Jr. | 84/1.18 X |
| 3,718,914 | 2/1973 | Muller | 328/124 X |
| 4,003,284 | 1/1977 | Marsh | 84/1.18 |

*Primary Examiner*—Stanley J. Witkowski
*Attorney, Agent, or Firm*—Lewis H. Eslinger; Alvin Sinderbrand

[57] ABSTRACT

A signal generating system for an electronic musical instrument utilizing an electronic beam tube with a radiation intercepting structure and means to derive a signal from beam current pulses produced by scanning the structure. The width of pulses is modulated according to the width of individual components of the structure and the pulse width modulated wave is transformed to analog form by a low pass filter. The structure includes several aligned sections and the widths of each section at corresponding points of alignment are representative of the pulse-sampled amplitudes of the tonal qualities of different musical instruments. The rate of repetitively scanning the mask determines the frequency of the musical note generated, and the signal that forms the note is produced by direct pick up of beam current from the radiation intercepting structure if the structure is a conductive target inside the tube or by secondary emission or by electro-optic transducing means in the case of an optical mask on a light-emitting tube.

12 Claims, 9 Drawing Figures

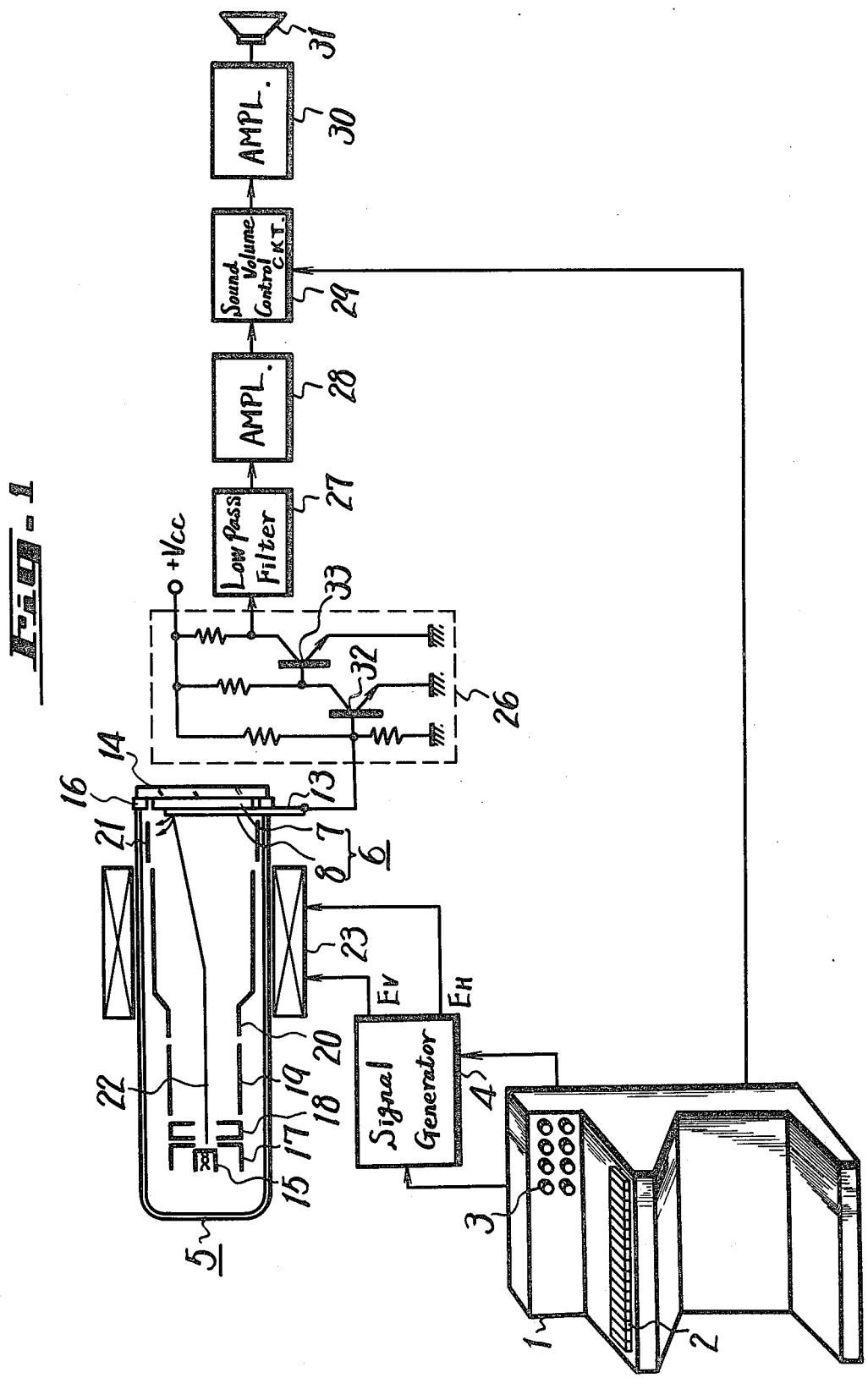

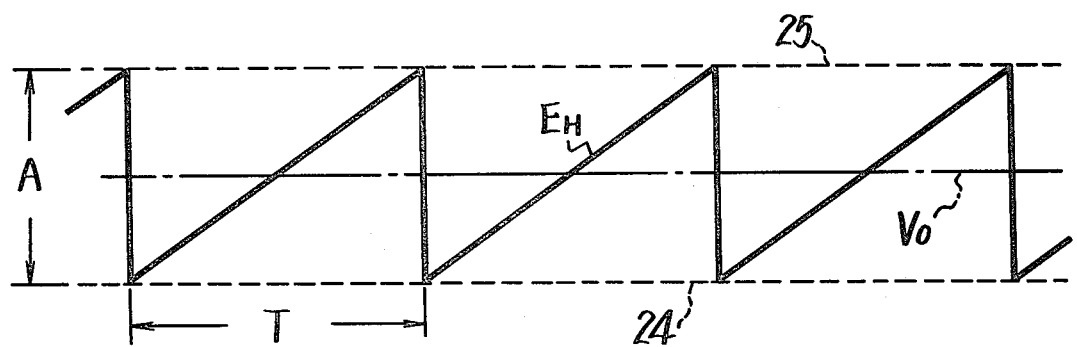
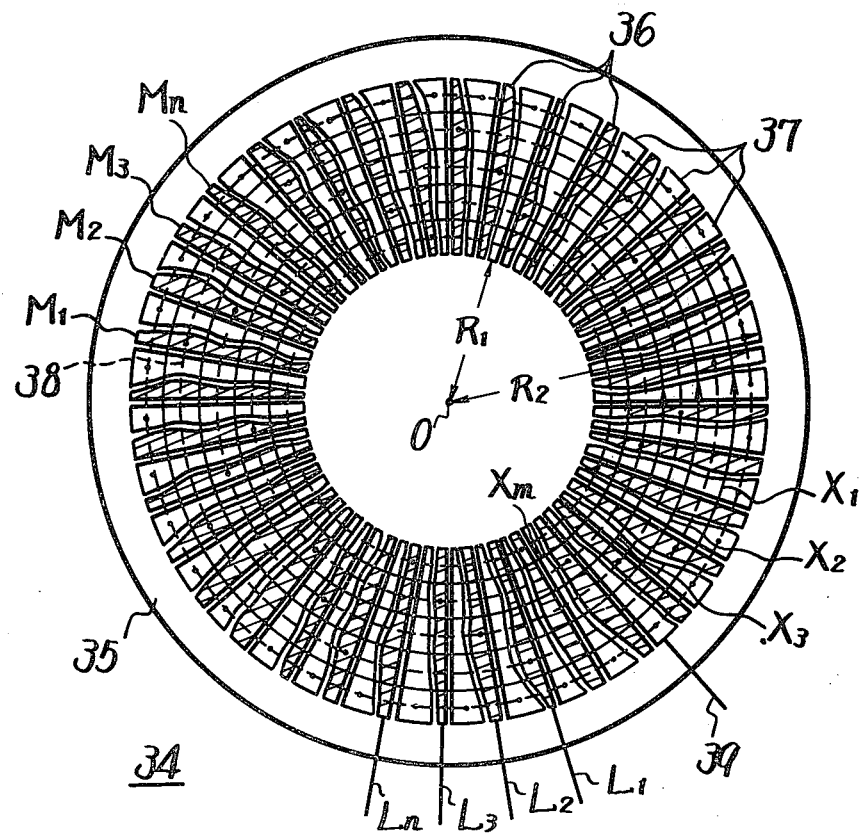

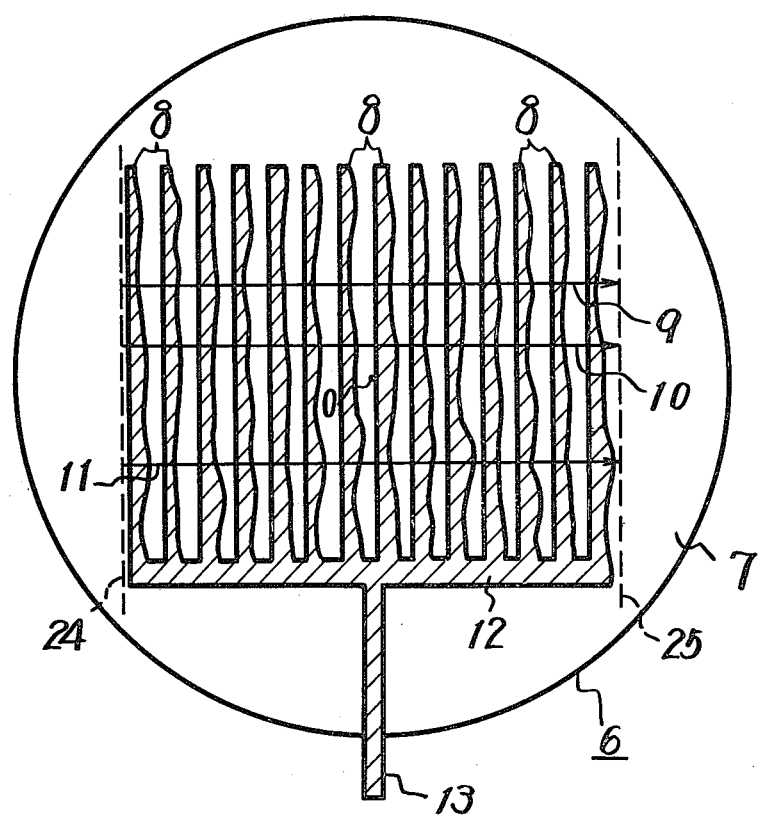
Fig. 3
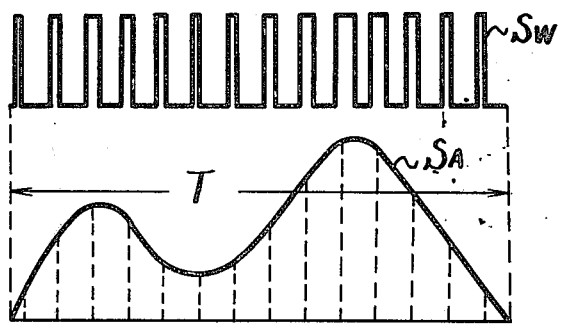
Fig. 4A
Fig. 4B

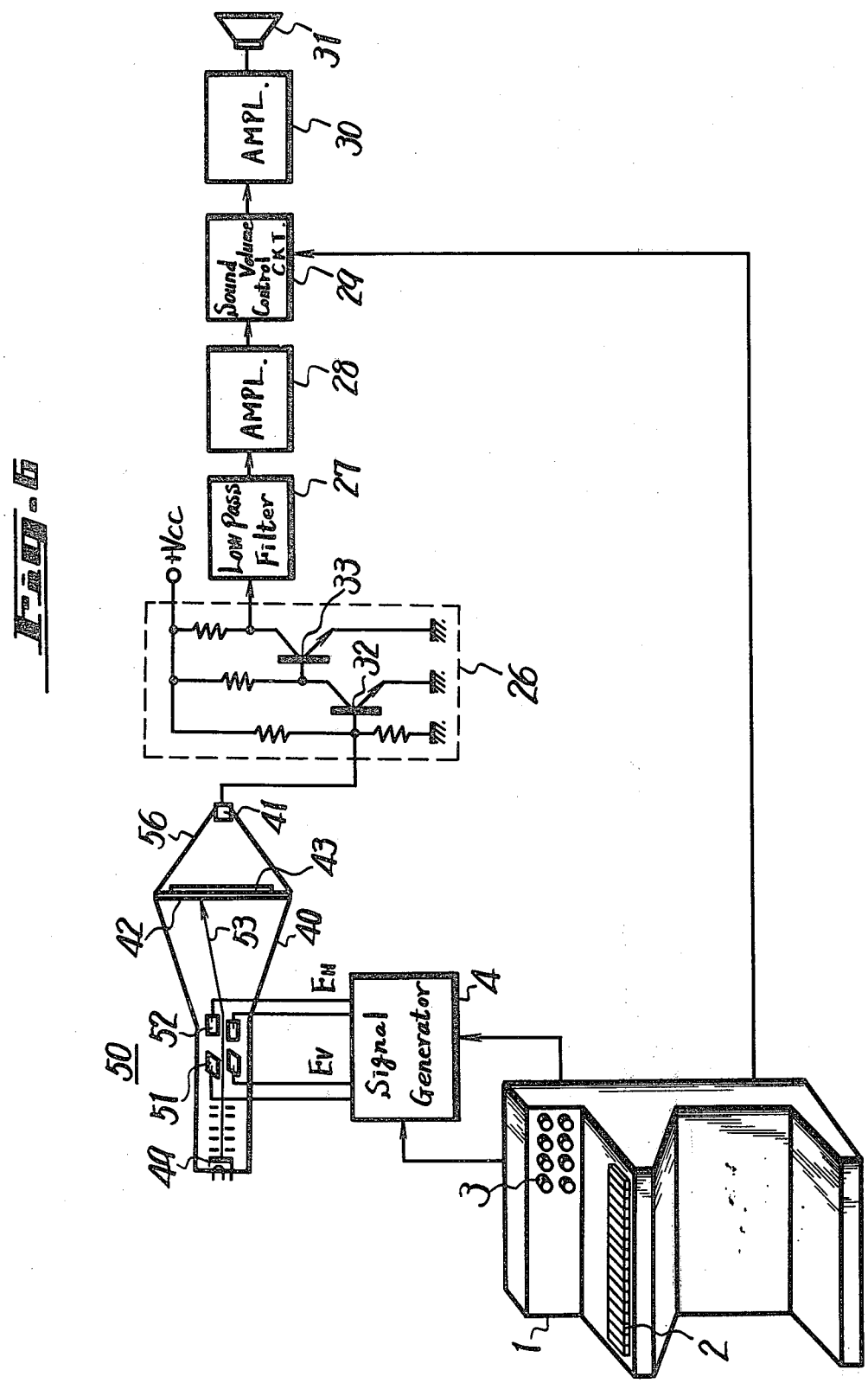

ent in the wavet signals have been ac-
SIGNAL GENERATING SYSTEM UTILIZING A CATHODE RAY TUBE

BACKGROUND OF THE INVENTION

1. Field of the Invention

This invention relates to a signal generating system and more particularly to a system and apparatus for generating electrical signals having the waveform of specific musical instruments and having a cathode ray tube with a target as the basic signal generating means.

2. Description of the Prior Art

Electronic simulation of complex musical waveforms of certain musical instruments, such as air driven organ pipes, has been achieved but presents a difficult technical problem. The difficulty is increased when an electronic organ is provided with stops to cause the generated sound signals to resemble those of other musical instruments, such as pianos, flutes, horns, etc.

Heretofore, electronic sound signals have been accomplished, with varying degrees of success, by synthesis of a complex electronic wave that supposedly resembles the desired tonal qualities of selected musical instruments. Electronic synthesis involves the use of oscillators to produce all of the necessary fundamental frequencies and the required harmonics in as close as approximation as possible to the harmonic content of the sound wave that is to be simulated.

The use of oscillators has a number of difficulties including, especially, the large number of oscillators required to produce all of the necessary musical notes. The oscillators must be extremely stable since a slight drift in one or more of the oscillators may considerably reduce the realism of the sound wave produced from the complex electronic waveform generated by the various oscillator signals.

In other sound generators used in prior art electronic organs, oscillators had been combined with frequency dividers to produce square waves with the proper fundamental frequency and with the necessary multiples thereof. The fundamental and frequency multiple square waves are combined, or synthesized, in desired ratios and are passed through a tone filter to remove undesired frequency spectral components. In general, the direct keying system is used for intermittently interrupting the square wave trains with the above harmonic series. However, a large number of filters is required to provide a desired ratio for the harmonic components to produce timbres. As a result conventional electronic organs are complicated in their construction.

OBJECTS AND SUMMARY OF THE INVENTION

It is an object of this invention to provide a signal generating system capable of producing a variety of sounds having predetermined harmonic contents.

It is another object of this invention to provide electronic tone generating apparatus utilizing a cathode ray tube with a target shaped to produce a pulse waveform with the width of pulses modulated according to the analog wave shape desired to be reproduced.

A further object of the present invention is to provide a musical instrument in which pulse width modulated means representative of desired wave shapes are stored and used to reproduce a musical note.

A still further object of the invention is to provide an electronic organ that includes means of a predetermined shape to produce a pulse width modulated signal repetitively at a frequency controlled by playing keys and having tonal qualities according to selected tone keys.

In accordance with the present invention a signal generating system is provided that is capable of reproducing all of the frequencies and tonal qualities of various musical instruments. The invention includes a cathode ray tube having target means in the tube or associated therewith with target sections of predetermined width so that, when scanned by the beam of the tube, a pulse signal will be produced with the width of the pulses modulated according to the tonal qualities of a selected musical instrument. The target means include different portions having different width modulations according to the tonal qualities of different musical instruments to produce wave shapes similar to those of a pipe organ or other instruments. The rate of repetitive scanning of the target region determines the frequency of the musical note, and means may be provided to modify the amplitude to produce such effects as sound decay corresponding to certain musical instruments.

The target means may include an internal target structure in the tube to intercept the electron beam directly and thereby produce a pulse width modulated signal. Alternatively, the target means may include an external optical structure combined with photosensitive means to produce the desired pulse width modulated signal from a cathode ray tube having a fluorescent screen.

BRIEF DESCRIPTION OF THE DRAWINGS

FIG. 1 is a simplified block diagram of an electronic organ including means for generating signals in accordance with the present invention.

FIG. 2 is a graph of a sawtooth wave produced in the operation of the apparatus of FIG. 1.

FIG. 3 shows one form of pattern to produce, when scanned by an electron beam of the type illustrated in FIG. 1, a pulse width modulated signal representative of selected tonal qualities of a sound wave from a selected musical instrument.

FIG. 4A shows a pulse width modulated signal produced by scanning a selected set of areas of the target in FIG. 3.

FIG. 4B shows an analog wave shape produced by demodulating the pulse width modulated wave of FIG. 4A.

FIG. 5 shows another type of target for the cathode ray tube in FIG. 1.

FIG. 6 shows a simplified block diagram of an electronic organ that includes another embodiment of this invention.

DESCRIPTION OF THE PREFERRED EMBODIMENTS

Figure 7:
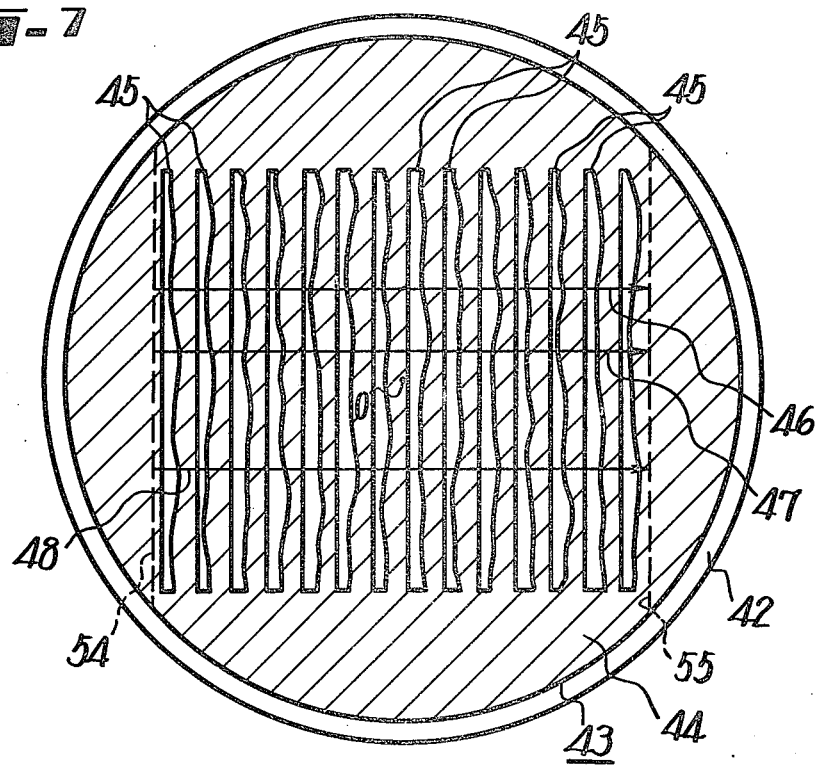
FIG. 7 shows an optical mask to be used with the cathode ray tube in FIG. 6 to generate pulse width modulated signals.

In FIG. 1 the enclosure, or cabinet, 1 of an electric organ has a keyboard 2 that includes sufficient keys for several octaves. It further includes means to detect which key is depressed as the organ is played and means for determining how forcefully keys are depressed. A tone selection keyboard 3 is also provided on the cabinet 1. Electronic components of the organ include a signal generator 4 that produces a direct voltage $E_V$ and a sawtooth wave voltage $E_H$ at its output terminals in response to operation of the keyboards 3 and 2, respectively. The value of the direct voltage $E_V$ is determined by operating a tone selection key on the keyboard 3, while the period of the sawtooth voltage $E_H$ is determined by the specific key depressed on the keyboard 2. This sawtooth wave is illustrated in FIG. 2, and its mean value $V_O$ and amplitude A are always constant.

The organ in FIG. 1 further includes a cathode ray tube 5 that has a special target 6 in the path of the electron beam. One form of the target is shown in FIG. 3 and consists of an insulating plate 7 and a plurality of strip electrodes 8 deposited in a generally parallel array within a rectangular region of the plate 7. The width of each electrode 8 varies along its length in a manner generally different from the variation of the width of any of the other electrodes. The widths of the electrodes 8 are proportional to values obtained by sampling, at a constant repetition rate, one period of a constant analog voltage that corresponds to a tone of a certain musical instrument. For example, the widths of the electrodes 8 at the level at which they would be struck in succession by an electron beam scanning along the path of an arrow 9 may be selected to correspond to the tone of a piano. The unevenness of the width from one electrode 8 to the next corresponds to the fact that the tone of a piano note is not a sinusoidal wave of a certain frequency but is a complex wave that includes a fundamental frequency and various harmonics in various amplitude relationships. The order in which the widths of the electrodes 8 in the path of the arrow 9 are arranged is selected to correspond to the order of sampled values of one period of a piano tone wave. Similarly, the widths of the electrodes 8 along the path indicated by an arrow 10 can be selected to correspond to the sampled values of an analog wave representative of the tone of a different musical instrument, such as a flute. In the same manner, the widths of the electrodes 8 along the level indicated by an arrow 11 can be selected to correspond to sampled values of an analog wave representative of the tone of still another musical instrument, such as a violin.

One end of each of the electrodes 8 is connected to a common conductor 12 which is connected, in turn, to a lead 13. The electrodes 8, the common conductor 12, and the lead 13 are formed by etching areas away from a conductive plate, such as an aluminum plate, coated on the insulating plate 7.

The target 6 is mounted on the inner surface of a face plate 14 of the cathode ray tube 5 so that the electrodes 8 are opposite a cathode 15. The center of the target is located on the axis of the tube and the direction of the electrodes is such that the paths of the arrows 9–11 are in the path of a single deflection direction, such as the horizontal deflection direction. The lead 13 extends through the wall of the cathode ray tube 5, and the perimeter of the target 6 is sealed to the tube wall by a soldering glass, or frit, 16. The cathode ray tube 5 further includes five electrodes 17–21, which may be referred to as the first through the fifth grid electrodes. An electron beam 22 of constant current is emitted from the cathode 15 and focused on the target 6 by suitable voltages applied to the electrodes 17–21.

Deflection means in the form of a yoke 23 that comprises a vertical deflection coil and a horizontal deflection coil are mounted on the tube 5. The direct current $E_V$ from the signal generator 4 is applied to the vertical deflection coil in the yoke 23 and the sawtooth wave current $E_H$ from the signal generator 4 is applied to the horizontal deflection coil in the yoke. These deflection signals cause the electron beam 22 to scan the target 6 along certain paths that intersect the electrodes 8. Since the horizontal deflection signal has a sawtooth wave form, and it has been assumed that the electrodes 8 are perpendicular to the horizontal direction, the beam 22 scans across the electrodes 8 at a level determined by the vertical deflection signal $E_V$. When the sawtooth wave signal $E_H$ is at its most negative value, the beam 22 is directed to strike a point on the target 7 indicated by the line 24. At the peaks of the horizontal deflection signal $E_H$, the beam 22 is directed to some point along a line 25 on the right hand side of the insulating plate 7. The lines 24 and 25 are only indicative of positions in FIG. 3 and are not actual lines on the plate 7. These lines are also represented in FIG. 2 by horizontal lines through the bottoms and tops, respectively, of the sawtooth deflection signal $E_H$. The signal $E_H$ is formed so as to have an extremely short flyback time interval, for example in the order of 1 microsecond, so that the beam 22 returns from the position indicated by the line 25 at the right hand side of the plate 7 in FIG. 3 to the position of the line 24 at the left hand side of the plate almost instantaneously. The period T of the sawtooth wave in FIG. 2 may thus be considered to be substantially equal to the time interval within which the beam 22 carries out its forward scanning from the position of the line 24 to the position of the line 25 in FIG. 3.

Returning to FIG. 1, the lead 13 of the target 6 is connected to an amplifier 26, and the output terminal of this amplifier is connected through a low pass filter 27 and another amplifier 28 and a sound volume control 29 to a power amplifier 30 that operates a speaker 31. Thus the input signal applied to the amplifier 26 corresponds to electrons derived from the beam 22 as the beam impinges on each of the electrodes 8 in succession. At the same time that the beam 22 impinges on each of the electrodes 8, a secondary electron is emitted from that electrode and is captured by the fifth grid electrode 21.

Before the organ 1 in FIG. 1 is played, one of the tone selection keys of the keyboard 3 is actuated to select a desired tone. This causes a direct voltage $E_V$ to be generated in the signal generator 4. For example, if the tone of a piano is selected by actuation of the proper key of the keyboard 3, the direct voltage $E_V$ from the signal generator 4 causes the vertical deflection means of the yoke 23 to deflect the beam 22 to a certain fixed vertical position such that the beam 22 scans the target 6 along the path of the arrow 9. Actuation of a key of the keyboard 2 causes the signal generator 4 to produce the sawtooth wave signal $E_H$ for horizontal deflection of the beam 22. Thus, the beam 22 scans the target 6 in the cathode ray tube 5 along a horizontal line indicated by the arrow 9 from the position indicated by the broken line 24 to that indicated by the broken line 25, and this scanning is repeated at a rate determined by the particular key actuated on the keyboard 2. When the beam 22 impinges on the electrodes 8 in scanning across them, a signal current flows in the base-emitter path of a transistor 32, which is the input stage of the amplifier 26. This current is derived from the electrodes 8 through the lead 13 due to the secondary electron emission.

At the collector output terminal of a transistor 33 that forms the output stage of the amplifier 26 there is obtained a pulse signal $S_W$ shown in FIG. 4A. The width of the pulses in this signal is modulated according to the widths of the individual electrodes 8 along the line of travel of the electron beam 22. The pulse width modulated (PWM) signal $S_W$, when passed through the low pass filter 27, is converted into a signal $S_A$ of varying amplitude as shown in FIG. 4B. The signal $S_A$ is the analog wave incorporated in the PWM signal $S_W$ and is representative of the tone of whatever musical instrument is selected by causing the beam 22 in FIG. 1 to traverse a particular path, for example, the path of the arrow 9 in FIG. 3. That tone has been arbitrarily assumed to be a piano tone.

A mirror image of the wave $S_W$ is obtained during the retrace of the beam 22 from the position 25 back to the position 24. However, the time interval of the retrace is so short that the amplitude of the analog signal produced by this retrace is negligibly small. Accordingly, if a certain key in the keyboard 2 is depressed and the beam 22 scans the target 6 along the path of the arrow 9 between the positions 24 and 25 repeatedly, the signal $S_A$ can be derived from the low pass filter 27 repeatedly at constant amplitude. The repetition frequency of the signal varies according to the particular key actuated on the keyboard 2. When "do", "mi" and "so" are actuated in a certain octave, the repeating frequencies are changed to be 1:9/8:3/2. This causes the speaker 31 to produce a sound similar to that produced by an actual piano.

Since the value of the direct voltage $E_V$ produced by the signal generator 4 is determined by the particular tone selection key actuated in the keyboard 3, the scanning position of the beam 22 on the target 6 is selected and the waveform of the signal derived from the apparatus is changed according to the desired tone, which may be that of a piano, flute, violin or other musical instrument. The single apparatus 1 in FIG. 1 can thus replace a number of musical instruments.

In the sound volume control circuit 29 there is a device, or means, to control the volume in a predetermined manner. For example, the circuit 29 may include an electro-optic coupler consisting of a luminous element that emits light having an intensity that corresponds to the amplitude of the output signal of the amplifier 28. The coupler also includes a photosensitive conversion element that receives light from the luminous element and converts the light into an electric signal to be fed to the amplifier 30. The amplitude of this electric signal may be modified by a shield plate between the luminous element and the photosensitive element and by making the shield plate movable to intercept a controllable amount of light passing between these two elements. In the present instance it is normally desirable that the volume be controlled so that it decreases gradually after the key on the keyboard 2 is depressed. This is consistent with the fact that in certain instruments the sound decays at an exponential rate.

Index electrodes can be provided on the insulating plate 7 at the positions indicated by the lines 24 and 25 and these index electrodes can be connected to the signal generator 4 so that when the horizontal deflection signal causes the beam to be deflected far enough to intercept the index electrode at the position of the line 25, a signal will automatically be generated to cause the generator to initiate the retrace and bring the electron beam 22 back to the line 24. When the beam returns to the position of the line 24 in FIG. 2, the signal $E_H$ can again start to increase at a constant gradient according to the musical note to be produced. Furthermore, during the time interval within which the beam 22 returns from the right hand position of the line 25 to the left hand position at the line 24, the beam 22 may be blanked off.

In the target 6 in the cathode ray tube 5 a separate, grounded electrode may be provided to surround the electrodes 8.

Although the signal current that produces the output signal of the cathode ray tube 5 may be derived from secondary emission of the electrons from the electrodes 8, it is also possible to capture electrons of the beam 22 directly to produce a signal current to be supplied to the amplifier 26.

While the electrodes 8 have been considered as extending in a vertical direction and the deflection across these electrodes has thus been considered to extend in a horizontal direction, it is equally possible to reverse these relative directions and arrange the electrodes 8 to be horizontal and the deflection to be vertical. There is no inherent reason as to why the deflection should be in any particular direction except that the electrodes are shaped so that the beam 22 should move across them at right angles to their long dimension.

FIG. 5 shows another embodiment of the target that can be used in the cathode ray tube 5 in FIG. 1. The target 34 in FIG. 5 consists of an insulating plate 35 with radial strip electrodes 36 formed thereon. The electrodes 36 do not extend entirely into the center O but are located between two radial distances $R_1$ and $R_2$ from this center. The electrodes are thus within an anular band.

The electrodes 36 are divided into a plurality of sets of interleaved electrodes extending around the circle. The interleaved sets include one set $M_1$, a second set $M_2$, and so on to a set $M_n$. The various electrodes 36 in the $n$ sets are connected together electrically by circular conductors shown in broken circular lines which represent conductors on the back surface of the plate 35. Each of the broken circular lines, except the outermost one, represents the connection to one set, and the connection between the circular lines and the electrodes in the set are represented by dots. For example, the broken circular line 38 has a dot at the position where it connects with each of the electrodes of the set $M_1$ of all of the electrodes 36. Thus the electrodes in the set $M_1$ corresponds to the electrodes 8 in FIG. 3, and the broken circular line 38 in FIG. 5 corresponds to the conductor 12 in FIG. 3.

It will be observed that there are 9 electrodes in the illustrated embodiment in the set $M_1$. These electrodes are scanned by causing the electron beam 22 of the tube 5 in FIG. 1 to trace out a circular path by applying two sinusoidal waves of equal amplitude from the signal generator 4 to the yoke 23. These sinusoidal waves are typically of the same amplitude (assuming the deflection sensitivity of the perpendicular deflection coils in the yoke 23 are equal). One of the signals applied to the yoke 23 may be defined by the mathematical representation A sin $\omega t$ and the other by A cos $\omega t$ since it is understood that the sine and cosine functions differ by 90°.

The amplitude A of these deflection signals determines the radius of the circle traced out by the beam 22. Several such circles $X_1$–$X_3$ are shown in the embodiment in FIG. 5. These circles correspond to the paths represented by the arrows 9–11 in FIG. 3. If the electron beam 22 is caused to trace out the circle $X_1$ in FIG. 5, the pulse waveform derived from the $M_1$ set of electrodes all connected together by the circular conductor represented by the broken circle 38 will produce a pulse waveform similar to that in FIG. 4A and representative of some selected musical instrument, such as a piano.

The other circular paths $X_2$ and $X_3$ produce differently modulated pulses that represent the tonal qualities of other musical instruments encoded into the electrodes of the set $M_1$ in a manner similar to the encoding of the electrodes 8 in FIG. 3.

The other sets of electrodes $M_2$-$M_n$ are connected in their respective groupings in the same manner as the set $M_1$. All of the electrodes $M_1$ are connected to a single output terminal $L_1$ and the other sets of electrodes $M_2$-$M_n$ are connected to corresponding terminals $L_2$-$L_n$.

The encoding of the electrodes in the set $M_2$ and the other sets $M_3$-$M_n$ may be different from that in the set $M_1$. As a result, as the electron beam 22 traces out the circle $X_1$ to create a piano tone from the set of electrodes $M_1$, the same beam also traces out another tone, usually different, from each of the other sets of electrodes $M_2$-$M_n$. The timing difference between the pulses generated as the beam intercepts the various members of the sets $M_1$-$M_n$ is extremely small compared to the audio frequencies into which the pulse wave is eventually transformed. The effect, for example, would be as if several additional sets of pulses were interleaved with the pulse wave $S_W$ in FIG. 4A. This means that in following one circle, for example the circle $X_1$, the terminals $L_1$-$L_n$ may produce signals representative of $n$ different musical instruments. In the same manner, the scanning of the beam along another circle $X_2$ may produce output signals at the terminals $L_1$-$L_n$ of another $n$ instruments. If each set of electrodes $M_1$-$M_n$ is encoded along its length in the radial direction of the array of electrodes to produce the tonal qualities of $m$ different musical instruments, the total array is capable of producing $m$ times $n$ tonal qualities, each corresponding to different musical instruments. Since the time required to trace out any circle is exactly the same for all of the sets of the electrodes $M_1$-$M_n$, the tones produced all have exactly the same frequency. Varying the angular frequency $\omega$ in the deflection signals varies the frequency of the output signals at the terminals $L_1$-$L_n$. The total period T required for the beam 22 to traverse a circle is $T = (2\pi/\omega)$, and the frequency produced in completing one circle is $\omega/2\pi$. Since the 360° point of a circle corresponds exactly to the 0° point, there is no flyback time in the scanning of the target 34 in FIG. 5 as there is in the case of the target 7 in FIG. 3 and so a tone wave with high fidelity can be produced.

The insulating plate 35 in FIG. 5 includes another set of electrodes 37 interleaved with the set 36. The electrodes 36 are shaded to make it easier to distinguish between the electrodes 36 and 37 visually. The electrodes 37 are provided for the same purpose as the electrodes 36, but all of the electrodes 37 are electrically connected together by a circular conductor represented by the outermost broken circle in the array in FIG. 5. As indicated by the dots on that circle, each of the electrodes 37 is connected to the same circular conductor. Since there are the same total number of electrodes 37 as the combined totals of sets $M_1$-$M_n$ of the electrodes 36, scanning of any of the circle paths $X_1$-$X_m$ produces a pulse wave from the output terminal 39 of the electrodes 37 and a very high pulse repetition rate. However, each pulse in this wave is width modulated just as the pulses from any of the sets of electrodes $M_1$-$M_n$ are width modulated. The high repetition rate pulses at the output terminal 39 may be demodulated in the same manner as the lower repetition rate pulses to produce the same sort of analog wave but one which may have higher analog frequencies. The electrodes 37 can produce the same number $m$ of separate tones as can any one of the sets $M_1$-$M_n$ as all of the electrodes 36 and 37 are scanned by the electron beam following any one of the circles $X_1$-$X_m$.

It is possible for the target to be formed of a single metal plate in which slots are formed that have widths corresponding to the electrode widths in FIG. 3. Then, an electrode may be provided behind the slotted metal plate to catch those electrons that pass through the metal plate, whereby a signal is produced by the captured electrons.

FIG. 6 shows an embodiment similar to FIG. 1 with many of the same components used. These components are identified by the same reference characters and their operation need not be described again. The feature in FIG. 6 that differs from FIG. 1 relates to the cathode ray tube. In FIG. 6 a cathode ray tube 40 of electrostatic deflection type is used. Such tubes are commonly used in oscilloscopes. A light receiving device 41 is placed in front of the face plate of the tube and opposed to a fluorescent screen 42 to receive light from the screen. An optical filter 43 is provided adjacent the screen 42 and between it and the light receiving device 41. This filter 43 is shown in more detail in FIG. 7, where it is seen to consist of an opaque disc 44 represented by the cross-hatched portion in the figure and having a plurality of light-permeable, or transparent, strip portions 45. The widths of the transparent portions 45 are varied in accordance with the sampled values of a constant analog wave representative of the tone of a musical instrument, such as a piano, within one period. One edge of the transparent portions 45 is spaced apart at an equal distance from the corresponding edge of the adjacent transparent portions 45 on each side and in the direction indicated by an arrow 46. The widths of the transparent portions 45 coincide with the amplitude of the sampled values of an analog wave within one period. Similarly, the widths of the transparent portions 45 along the path indicated by an arrow 47 correspond to an analog wave representation of the tone of another musical instrument such as a flute and the widths of the transparent portions on still another line indicated by an arrow 48 correspond to sampled value of an analog wave representative of the tome of another musical instrument such as a violin.

The optical filter 43 thus constructed and located in FIG. 6 between the screen 42 of the tube 40 and the light receiving device 41 allows light from the screen to pass through the transparent portions as the beam 53 is caused to scan the screen. The tube includes a cathode 49 that directs the beam 53 along the axis of the tube 40 so that, in the absence of deflection, the beam strikes the center O of the filter 43. In the manner considered in connection with FIG. 2, the beam may be displaced above or below a central position and may be deflected left to right to follow paths indicated by the arrows 46-48.

In FIG. 6 the deflection means 50 include vertical deflection plates 51 and horizontal deflection plates 52. These pairs of deflection plates are supplied with the direct voltage $E_V$ and the sawtooth wave voltage $E_H$, respectively, from the signal generator 4. The magnitude of the voltage $E_V$ determines which of the horizontal paths will be followed when the beam is deflected from left to right to trace out the paths indicated by the arrows 46-48 in FIG. 7.

The horizontal scanning operation of the beam 53 in FIG. 6 is determined by the sawtooth wave voltage $E_H$. This may be considered to have the same waveform as the signal $E_H$ in FIG. 2, but the fact that the deflection of the beam in FIG. 6 is accomplished by electrostatic plates means that the deflection signal $E_H$ generated by the signal generator 4 in FIG. 6 will be a voltage, whereas the signal $E_H$ applied to the yoke 23 in FIG. 1 was actually a current. The deflection, as indicated in FIG. 7, carries the beam between a position indicated by a line 54 on the left and a line 55 on the right, in a manner entirely analogous to the deflection in FIG. 3. As in the previous embodiment, it is desirable for the retrace time of the beam 53 in FIG. 6 to be as short as possible, for example, 1 microsecond. This interval is neglible in comparison to the audio signals generated and therefore the period T of the sawtooth voltage $E_H$ is substantially equal to the time interval in which the beam 53 in FIG. 6 scans from the left hand position, indicated by the line 54 in FIG. 7, to the right hand position, indicated by the line 55, in FIG. 7.

When the beam 53 in FIG. 6 scans the screen 42, light from the screen is received by the receiving device 41 only when that light passes through the transparent areas of the filter 43. In order to prevent external light from reaching the receiving device 41, a shield plate 56 is provided between the screen 42 and the receiving device 41.

In FIG. 7 the widths of the transparent portions 45 of the disc 44 can be shaped to serve as memories for exactly the same type of information as the electrodes 8 in FIG. 3. Therefore exactly the same type of operation can be performed on the embodiment in FIG. 6 to obtain musical tones representative of different instruments as was performed in the embodiment of FIG. 1. The only difference is that the pulses produced in the embodiment of FIG. 6 have their widths modulated by the length of time it takes the scanning beam to scan across the transparent slots 45. The light signals thus generated are transformed by the light receiving device 41 into the pulse width modulated wave similar to the wave $S_W$ in FIG. 4A. Different instrument tonal qualities can be reproduced by having the electron beam 53 scan lines represented by the different arrows 46, 47 or 48.

Figure 8:
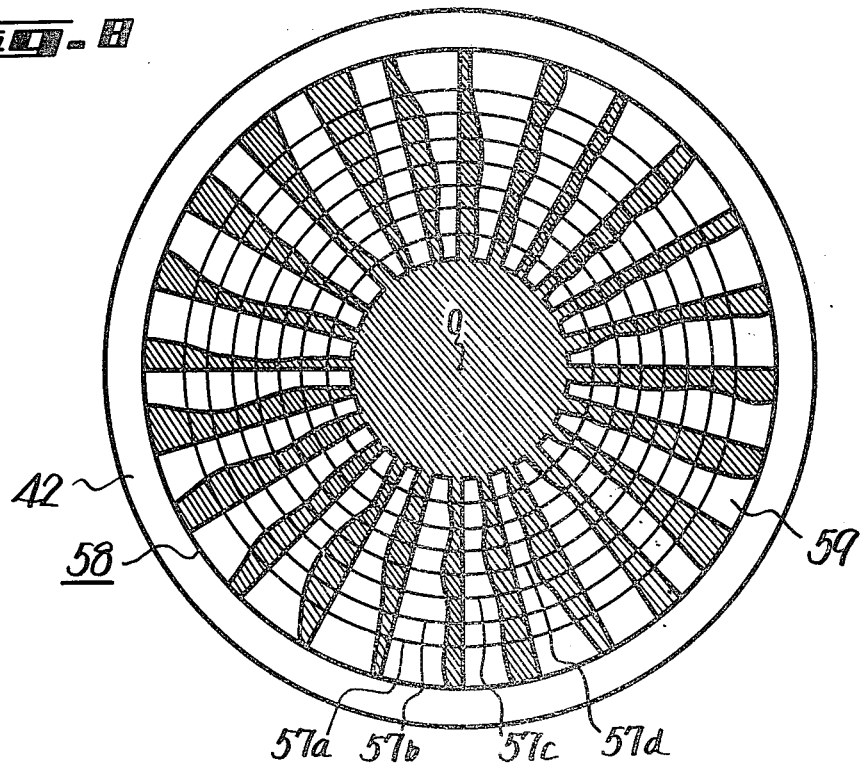
FIG. 8 shows a further form of the optical mask to generate pulse width modulated signals in the organ in FIG. 6.

FIG. 8 shows another optical filter that produces effects similar to the filter 43 in FIG. 7. However, the filter 58 has opaque strips arranged radially around an opaque region extending outwardly from the center O. The center O coincides with the axis of the cathode ray tube 40 in FIG. 6.

The widths of the transparent regions 59 between the opaque radial strips allow light to pass through to the light receiving device 41 and vary similarly to slots 45.

By applying suitable sinusoidal and cosinusoidal deflection voltages from the signal generator 4 to the deflection plates 51 and 52 of the tube 40 in FIG. 6, the beam 53 may be caused to follow circular paths 57a, 57b, 57c, and 57d, etc. Each of those paths causes pulses of light to reach the light receiving device 41 in width modulated pulses corresponding to the tones of different musical instruments in the same way that pulses were produced by causing the beam to scan the electrodes 36 and 37 in FIG. 5 along the circular paths. As in the previous embodiment, the particular circle followed by the beam in FIG. 8 depends on the amplitude of the deflecting signals. There is no flyback interval in this circular arrangement in FIG. 8, and thus the tone waves produced thereby can have high fidelity.

It is apparent that the invention is not limited to the embodiments used to illustrate it. The true scope of the invention is determined by the following claims.

What is claimed is:

1. A signal generating system comprising:
   a tube including a target having width modulated elements, and means directing an electron beam against said target;
   deflection means to cause the electron beam to scan said elements in a direction substantially along the width of said elements at predetermined points along the length of said elements;
   variable frequency oscillator means connected to said deflection means to produce scanning fields for said beam at a selected frequency;
   means to derive a pulse width modulated signal in response to the scanning of said elements by said beam; and
   means to convert said pulse width modulated signal to a continuous analog signal.

2. The system of claim 1; in which said target includes an insulator and said elements are constituted by electrodes deposited on said insulator.

3. The system of claim 1; in which said target is in the form of an optical mask and said tube has light generating means, said mask being located to intercept light from said light generating means; said system further comprising photoelectric means to convert into an electrical signal light passing through said elements of the mask from said light generating means and being modulated by movement of said electron beam relative to said mask.

4. The system of claim 1; in which said oscillator means produces a deflection signal to effect linear deflection of said beam.

5. The system of claim 1; in which said elements are arranged radially in a circle, and said oscillator means produces sinusoidal signals to cause said deflection means to move said beam in a circular path.

6. The system of claim 1; in which said elements extend generally parallel to each other and said oscillator means produces a sawtooth wave deflection signal to deflect said beam across said elements.

7. The system of claim 3; in which said elements of said optical mask are apertures defined by the edges of opaque material, and said apertures are arranged in a circle and are elongated in the radial direction and width modulated perpendicular to the radial direction; and in which said oscillator means comprises sine and cosine wave generating means.

8. A musical instrument comprising:
   an electron tube including means having at least one two-dimensional pattern defined by a plurality of elongated elements, each incremental part of the length of each of said plurality of elements having a width representing the amplitude of a respective one of a plurality of sampled points of a musical waveshape; and means directing an electron beam toward said pattern of elongated elements;
   deflecting means for causing said beam to scan said plurality of said elements selectively to generate a width modulated pulse wave in accordance with said pattern;
   a variable frequency oscillator supplying deflecting signals to said deflecting means for causing said electron beam to scan said pattern of elements at a selected frequency;

analog forming means to convert said width modulated pulse wave to a signal of analog form corresponding to said musical waveshape;

a first keyboard representing tonal characteristics simulating a musical instrument, said keyboard controlling said deflecting means to determine which incremental parts of said elements are scanned;

a second keyboard having keys corresponding to notes and connected to control said variable frequency oscillator to determine the frequency of scanning of said pattern when one of said keys of said second keyboard is depressed; and means for amplifying said signal of analog form and converting the same to a sound.

9. A musical instrument according to claim 8; wherein said elements constitute electrodes on a target, each said incremental part of each of said electrodes being aligned along a respective line with corresponding incremental parts of the other electrodes, said deflecting means deflecting said electron beam in a direction along a selected line to impinge successively on the respective incremental parts of said electrodes, and the selection of tonal characteristics of said notes being determined by the position of said beam perpendicular to the deflection direction thereof.

10. A musical instrument according to claim 8; wherein said electrodes extend radially in a circular arrangement, said deflecting means deflects said electron beam in a circular path, and the selection of tonal characteristics is determined by the radius of said circular path.

11. A musical instrument according to claim 8; wherein said pattern is formed of elongated, width modulated apertures extending generally parallel to each other through a film, said deflecting means deflects said electron beam along a straight line across said apertures, and the selection of tonal characteristics is determined by the position of said electron beam perpendicular to the scanning direction thereof.

12. A musical instrument according to claim 8; wherein said pattern is formed of elongated, width modulated apertures through a film, said elongated apertures are radially arranged on a circle, said deflecting means deflects said electron beam along a circular path across said apertures, and the selection of tonal characteristics is determined by the radius of the circular path.

* * * * *